(12) United States Patent
Chu et al.

(10) Patent No.: US 6,767,766 B2
(45) Date of Patent: Jul. 27, 2004

(54) ELECTRONIC MODULE WITH INTEGRATED PROGRAMMABLE THERMOELECTRIC COOLING ASSEMBLY AND METHOD OF FABRICATION

(75) Inventors: Richard C. Chu, Poughkeepsie, NY (US); Michael J. Ellsworth, Jr., Lagrangeville, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/368,192

(22) Filed: Feb. 18, 2003

(65) Prior Publication Data

US 2003/0122245 A1 Jul. 3, 2003

Related U.S. Application Data

(62) Division of application No. 09/726,909, filed on Nov. 30, 2000, now Pat. No. 6,548,894.

(51) Int. Cl.$^7$ .......................... H01L 21/44; H01L 21/48; H01L 21/50
(52) U.S. Cl. ........................................ 438/122; 438/125
(58) Field of Search ................................ 438/122, 125; 136/203; 257/93, 706

(56) References Cited

U.S. PATENT DOCUMENTS

| | | | |
|---|---|---|---|
| 4,983,225 A | 1/1991 | Rowe .......................... 136/201 |
| 5,188,286 A | * 2/1993 | Pence, IV ..................... 236/1 F |
| 5,261,747 A | 11/1993 | Deacutis et al. ............. 374/137 |
| 5,576,512 A | 11/1996 | Doke .......................... 136/203 |
| 5,637,921 A | 6/1997 | Burward-Hoy ............. 257/712 |
| 5,712,448 A | 1/1998 | Vandersande et al. ...... 136/203 |
| 5,956,569 A | 9/1999 | Shiu et al. ..................... 438/48 |
| 6,000,225 A | 12/1999 | Ghoshal ........................ 62/3.7 |
| 6,043,423 A | 3/2000 | Satomura et al. ........... 136/211 |
| 6,065,293 A | 5/2000 | Ghoshal ........................ 63/3.2 |
| 6,127,619 A | 10/2000 | Xi et al. ...................... 136/203 |
| 6,164,076 A | 12/2000 | Chu et al. ...................... 62/3.7 |
| 6,396,700 B1 | 5/2002 | Chu et al. .................... 361/705 |
| 6,424,533 B1 | 7/2002 | Chu et al. .................... 361/719 |
| 6,489,551 B2 | 12/2002 | Chu et al. .................... 136/230 |

OTHER PUBLICATIONS

K. F. Beckham, et al., Abstract, "A Laser Cleaning Process to Remove Debris and Contaminations on the Bonding Pad", reproduced from Research Disclosure, Nov. 1998, No. 295, Kenneth Mason Publications, Ltd., England.

(List continued on next page.)

*Primary Examiner*—Alexander Ghyka
(74) *Attorney, Agent, or Firm*—Andrew J. Wojnicki, Esq.; Kevin P. Radigan, Esq.; Heslin Rothenberg Farley & Mesiti P.C.

(57) ABSTRACT

An electronic module and method of fabrication are provided employing an integrated thermal dissipation assembly. The thermal dissipation assembly includes a thermoelectric assembly configured to couple to an electronic device within the module for removing heat generated thereby, and a programmable power control circuit integrated with the thermoelectric assembly. The programmable power control circuit allows cooling capacity of the thermoelectric assembly to be tailored to anticipated heat dissipation of the electronic device by adjusting, for a given power source, voltage level to the thermoelectric elements of the thermoelectric assembly. Power to the thermoelectric assembly can be provided through conductive power planes disposed within a supporting substrate. The power control circuit includes one or more voltage boost circuits connected in series between the given power source and the thermoelectric elements of the associated thermoelectric assembly.

6 Claims, 3 Drawing Sheets

OTHER PUBLICATIONS

Robert W. Erickson, University of Colorado, textbook "Fundamentals of Power Electronics", Kluwer Academic Publishers, pp. 24 & 138, 1st Edition, 1997.

J.–P. Fleurial et al., "Thermoelectric Microcoolers for Thermal Management Applications", 16th International Conference on Thermoelectronics, International Conference on Thermoelectrics, IEEE (1997).

J.–P. Fleurial et al., "Thick–Film Thermoelectric Microdevices", 18th International Conference on Thermoelectrics, IEEE (1999).

Jan W. Vandersande et al., "Thermal Management of Power Electronics using Thermoelectric Coolers", 15th International Conference on Thermoelectrics, IEEE (1996).

* cited by examiner

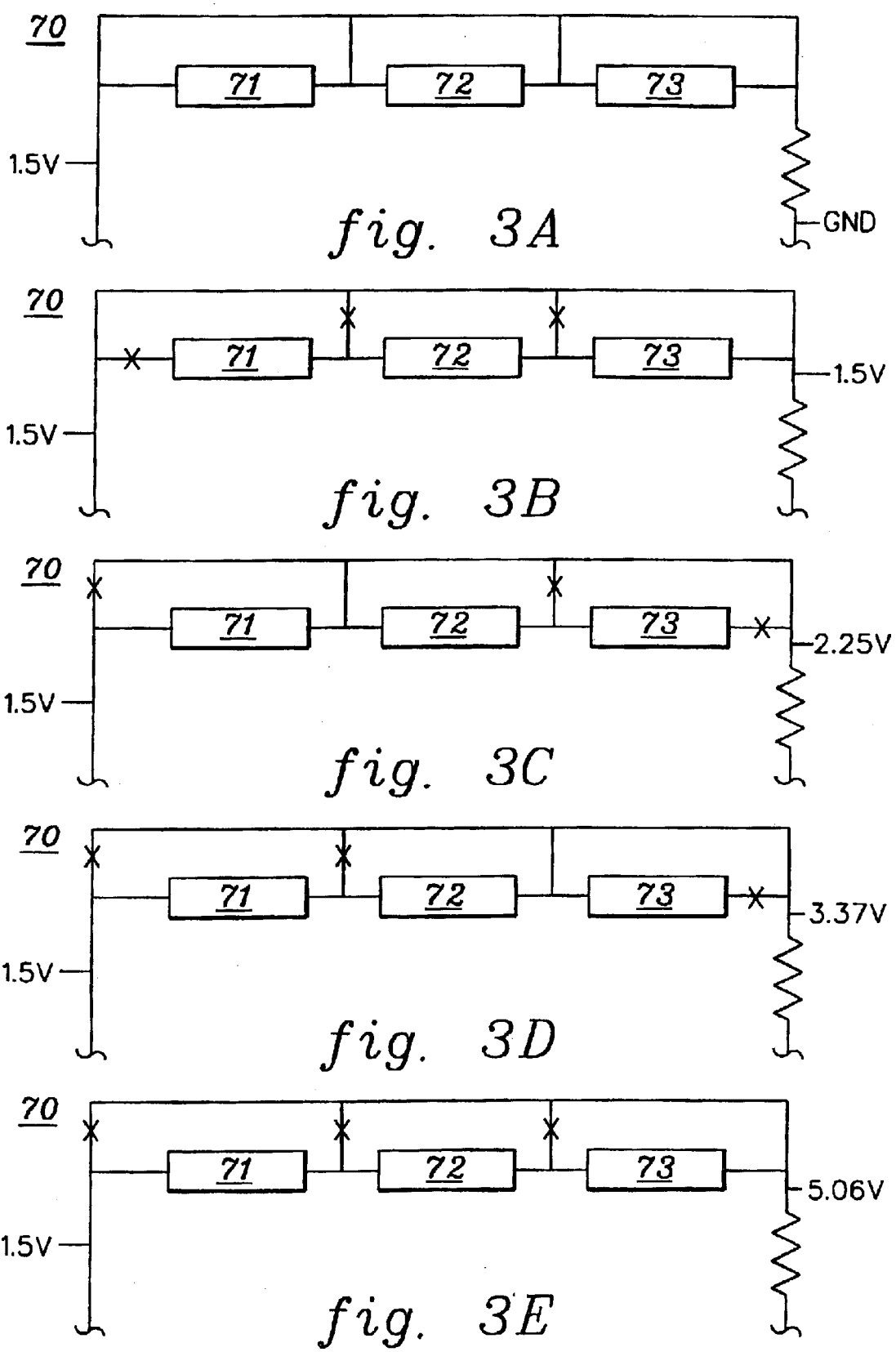

ELECTRONIC MODULE WITH INTEGRATED PROGRAMMABLE THERMOELECTRIC COOLING ASSEMBLY AND METHOD OF FABRICATION

CROSS-REFERENCE TO RELATED APPLICATIONS

This application is a divisional of U.S. patent application Ser. No. 09/726,909, filed Nov. 30, 2000 now U.S. Pat. No. 6,548,894, entitled "Electronic Module With Integrated Programmable Thermoelectric Cooling Assembly and Method of Fabrication", the entirety of which is hereby incorporated herein by reference.

This application also contains subject matter which is related to the subject matter of the following applications, which are assigned to the same Assignee as this application. The below-listed applications are hereby incorporated herein by reference in their entirety:

"ELECTRONIC MODULE WITH INTEGRATED THERMOELECTRIC COOLING ASSEMBLY," by Chu et al., U.S. Pat. No. 6,489,551, issued Dec. 3, 2002;

"THERMOELECTRIC COOLING ASSEMBLY WITH THERMAL SPACE TRANSFORMER INTERPOSED BETWEEN CASCADED THERMOELECTRIC STAGES FOR IMPROVED THERMAL PERFORMANCE," by Chu et al., U.S. Pat. No. 6,164,076, issued Dec. 26, 2000;

"THERMOELECTRIC-ENHANCED HEAT SPREADER FOR HEAT GENERATING COMPONENT FOR AN ELECTRONIC DEVICE," by Chu et al, U.S. Pat. No. 6,424,533, issued Jul. 23, 2002; and "THERMAL SPREADER AND INTERFACE ASSEMBLY FOR HEAT GENERATING COMPONENT OF AN ELECTRONIC DEVICE," by Chu et al., U.S. Pat. No. 6,396,700, issued May 28, 2002.

TECHNICAL FIELD

The present invention is directed to cooling assemblies and other apparatus used for removing heat from electronic devices. More particularly, the present invention is directed to an electronic module with integrated thermoelectric cooling elements. Even more particularly, this invention is directed to an enhanced thermoelectric apparatus having an integrated power control circuit which provides a programmable voltage level from a given power source, to allow customization of the cooling capacity of the thermoelectric assembly when the thermoelectric assembly is interposed within an electronic module in thermal contact with a heat generating component thereof, such as an integrated circuit chip.

BACKGROUND OF THE INVENTION

As is well known, as the circuit density of electronic chip devices increases, there is a correspondingly increasing demand for the removal of heat generated by these devices. The increased heat demand arises both because the circuit devices are packed more closely together and because the circuits themselves are operated at increasingly high clock frequencies. Nonetheless, it is also known that runaway thermal conditions and excessive heat generated by chips is a leading cause for failure of chip devices. Furthermore, it is anticipated that the demand for heat removal for these devices will increase indefinitely. Accordingly, it is seen that there is a large and significant need to provide useful cooling mechanisms for electronic circuit devices.

Thermoelectric cooling elements operate electronically to produce a cooling effect. By passing a direct current through the legs of a thermoelectric device, a temperature difference is produced across the device which is contrary to that which would be expected from Fourier's Law.

At one junction of the thermoelectric element both holes and electrons move away, toward the other junction, as a consequence of the current flow through the junction. Holes move through the p-type material and electrons through the n-type material. To compensate for this loss of charge carriers, additional electrons are raised from the valence band to the conduction band to create new pairs of electrons and holes. Since energy is required to do this, heat is absorbed at this junction. Conversely, as an electron drops into a hole at the other junction, its surplus energy is released in the form of heat. This transfer of thermal energy from the cold junction to the hot junction is known as the Peltier effect.

Use of the Peltier effect permits the surfaces attached to a heat source to be maintained at a temperature below that of a surface attached to a heat sink. What these thermoelectric modules provide is the ability to operate the cold side below the ambient temperature of the cooling medium (air or water) or provide greater heat removal capacity for a given cold plate or component temperature. When direct current is passed through these thermoelectric modules a temperature difference is produced with the result that one side is relatively cooler than the other side. These thermoelectric modules are therefore seen to possess a hot side and a cold side, and provide a mechanism for facilitating the transfer of thermal energy from the cold side of the thermoelectric module to the hot side of the module.

SUMMARY OF THE INVENTION

Conventional configurations and positionings of thermoelectric assemblies are nonetheless seen herein to be unnecessarily limiting in terms of the thermal energy which may be transferred and the long term reliability attained. Thus, while the use of thermoelectric devices is seen to provide a means for the solid state cooling of adjacent electrical devices, their efficiency and reliability has been less than optimal.

In addition, as complementary metal oxide semiconductor (CMOS) circuit and process technologies approach scaling limits, it becomes necessary to seek approaches and opportunities to achieve further performance gains. One avenue which is receiving increased attention is the operation of CMOS circuits at lower temperatures. The circuit performance enhancements which may be achieved vary from about 1.1x at a cooling condition of 250° C., to 18x at a cooling condition of −200° C. To obtain cooling conditions down to about 50° C. or so, conventional refrigeration technology may be utilized. However, conventional refrigeration systems may be difficult to control for variations in heat load, and may not be responsive enough during transient operating conditions.

Thermoelectric devices, used in conjunction with other module cooling technologies, are known to be able to lower junction temperatures below that which can be achieved by the other module cooling technologies alone. Problems arise, however, when thermoelectric devices are taken down in temperature below the ambient, and in particular, below the environment dew point temperature. Traditionally, thermoelectric devices, which are separate from and attached to an electronic module casing (i.e., cap) are exposed to the system environment. When brought down in temperature below the dew point, condensation forms. This condensation significantly reduces the fatigue life due to corrosion of the solder joints forming the thermoelectric junctions. In fact, the mere presence of oxygen accelerates solder fatigue cracking.

Advantageously, disclosed herein is a means for improving thermoelectric device reliability when used in conjunction with cooling of electronic modules. Specifically, a thermoelectric apparatus is integrated within an electronic module itself so that the thermoelectric apparatus is maintained in a controlled, i.e., oxygen and moisture restricted, environment. Furthermore, by integrating a thermoelectric apparatus into the electronic module, power delivery to the thermoelectric devices can be integrated with the module, thus simplifying system level design, i.e., in comparison with delivering power to externally mounted thermoelectric devices.

Further, disclosed herein is the use of thin-film integrated thermoelectric assemblies as a means of achieving reduced temperatures on individual chips within a multi-chip module (MCM). The conventional approach to cooling a multi-chip module is to sandwich a large thermoelectric cooler between the top surface of the MCM and a heat sink. While this approach works for a single chip module with a single heat source, it is not believed satisfactory for a multi-chip module with chips dissipating different amounts of heat. The thermoelectric junctions over the high heat dissipating chips would be over-loaded and those over the lower power chips would be underutilized. The result would be a higher temperature than desired on the higher dissipating chips (i.e., higher power chips) and lower than desired temperatures on the lower heat dissipating chips (i.e., lower power chips). The present invention addresses this problem by integrating a discrete thin-film thermoelectric assembly atop each chip within a multi-chip module, and further by making these individual thermoelectric assemblies programmable by tailoring the voltage level available to each thermoelectric assembly. This tailoring of the thermoelectric assembly is achieved without adjusting the number, size and geometry of the thermoelectric elements to match the individual cooling capacity of the associated chip heat load. Thus, the present invention accomplishes programmable thermoelectric cooling using a common thermoelectric device design.

To summarize, in one aspect, presented is a thermal dissipation assembly for an electronic device. The dissipation assembly includes a thermoelectric assembly configured to couple to the electronic device for removing heat generated thereby, and a programmable power control circuit. The programmable power control circuit is integrated with the thermoelectric assembly and allows cooling capacity of the thermoelectric assembly to be tailored to anticipated heat dissipation of the electronic device by adjusting, for a given power source, voltage level to the thermoelectric elements of the thermoelectric assembly. An electronic circuit and multi-chip module employing the thermal dissipation assembly are also described and claimed herein.

Further, in another aspect, a method of fabricating an electronic circuit is presented which includes: providing at least one electronic device; thermally coupling at least thermoelectric assembly to the at least one electronic device, wherein each thermoelectric assembly includes a programmable power control circuit for adjusting, for a given power source, voltage level to thermoelectric elements thereof; connecting the given power source to the at least one thermoelectric assembly through the programmable power control circuit; and employing the programmable power control circuit to tailor the voltage level to the thermoelectric elements of the at least one thermoelectric assembly, the tailoring being based upon anticipated heat dissipation of the at least one electronic device to which the at least one thermoelectric assembly is thermally coupled.

As a further enhancement, by integrating thermoelectric cooling assemblies within the electronic module, power delivery to the thermoelectric elements can be simplified by eliminating discrete wiring outside of the module. Wire bond or electrical spring contacts can be employed within the module to couple the thermoelectric stages to appropriate power planes, e.g., disposed within the substrate of the module.

Additional features and advantages are realized through the techniques of the present invention. Other embodiments and aspects of the invention are described in detail herein and are considered part of the claimed invention.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawing in which:

FIG. 3A depicts one embodiment of a programmable power control circuit to be integrated in a thermoelectric cooling assembly in accordance with the principles of the present invention; and FIGS. 3B–3E depict various programmed configurations of the power control circuit of FIG. 3A attained using various laser delete patterns as shown.

BEST MODE FOR CARRYING OUT THE INVENTION

Generally stated, provided herein is an electronic module with an integrated thermoelectric cooling assembly for removing heat from an electronic device thereof, such as an integrated circuit chip. The thermoelectric cooling assembly and electronic device are sealed together within the module, for example, between a substrate and a thermally conductive cap. In one embodiment, a module comprises a multi-chip module (MCM) wherein each electronic device within the module has coupled thereto a programmable thermoelectric cooling assembly in accordance with the present invention. Each programmable thermoelectric cooling assembly has a same number and geometry of thermoelectric elements, but can be tailored (i.e., programmed) through a power control circuit integrated into each thermoelectric assembly. For example, the power control circuit may comprise a series of voltage boost circuits which (using laser delete techniques) may be added or removed to adjust a voltage level to each thermoelectric assembly based upon anticipated heat dissipation of the corresponding electronic device within the multi-chip module.

Figure 1:
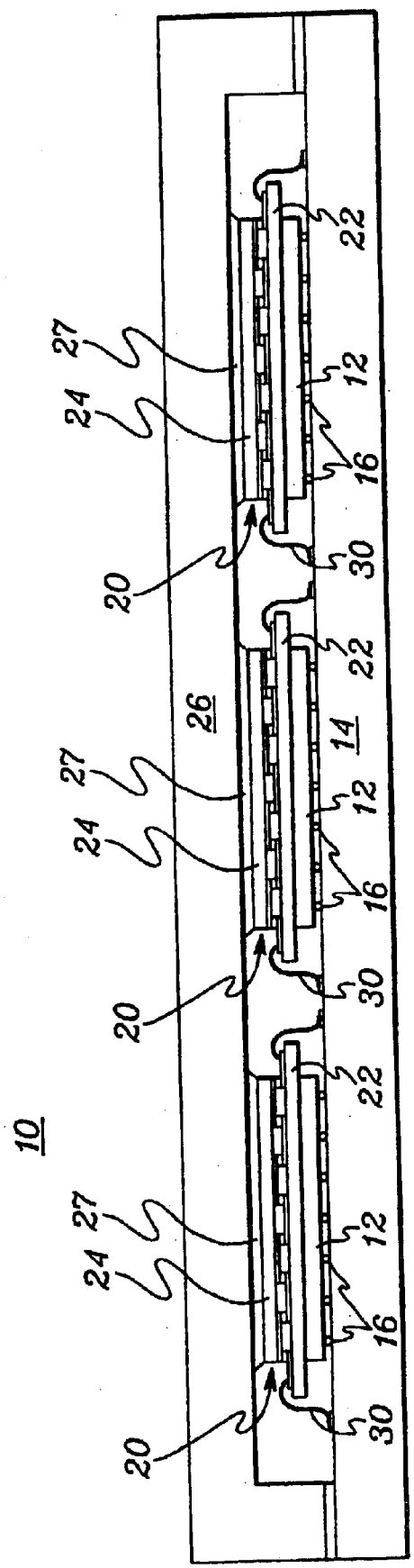
FIG. 1 is an elevational view illustrating one embodiment of a multi-chip module (MCM) employing integrated thermoelectric assemblies in accordance with the principles of the present invention.

FIG. 1 depicts one embodiment of an electronic module, generally noted 10, in accordance with the principles of the present invention. Although depicted in FIG. 1 and described hereinbelow with reference to a multi-chip module having a single thermoelectric cooling stage coupled to each chip, the programmable thermoelectric assembly of the present invention could equally be applicable to an electronic module having a single electronic device with, e.g., one or more thermoelectric stages thermally coupled thereto.

In the embodiment of FIG. 1, module 10 comprises a multi-chip module (MCM) wherein three electronic devices 12, (for example, integrated circuit chips) are mounted on a substrate 14 and electrically connected to circuitry on or within substrate 14 via conventional metal connections, such as solder bumps 16. A separate thermoelectric cooling assembly 20 is thermally coupled to each different electronic device 12 within the module. Further, each thermoelectric cooling assembly 20 is thermally coupled, for example, by means of a thermal paste or grease, to a module cap 26. The total module heat load, including the power dissipation of the thermoelectric cooling assemblies, can be removed by means of a heat sink or cold plate (not shown) attached to the exposed surface of module cap 26.

As noted above, it is well known that by passing direct current through a series of thermoelectric couples, one side of the thermoelectric will transfer heat to the other side. Essentially, heat is "electronically" pumped from the cold side to the hot side. In the embodiment of FIG. 1, the cold side of each cooling assembly is thermally coupled to an upper surface of an electronic device 12, for example, employing an appropriate oil or phase change interface material, such as Chomerics' Thermflow™ T310 material marketed by Parker Hannifin Corporation of Woburn, Mass.

Heat which flows out the hot side of a set of thermoelectric couples will be comprised of the active heat pumped, in addition to the power dissipation of the thermoelectric couples in performing the electronic heat pumping action. In this example, heat flows through the thermoelectric assembly 20 to thermal grease 27 and thereafter to thermally conductive cap 26, which as noted may be coupled to a cold plate (not shown).

As an alternative embodiment, one or more of the thermoelectric cooling assemblies 20 could comprise a multistage cooling assembly employing two or more cascaded thermoelectric stages with a lightweight "thermal space transformer" disposed therebetween to distribute heat from a first stage to a second stage. Such an assembly is described in detail in the above-incorporated United States Patent Application entitled, "THERMOELECTRIC COOLING ASSEMBLY WITH THERMAL SPACE TRANSFORMER INTERPOSED BETWEEN CASCADED THERMOELECTRIC STAGES FOR IMPROVED THERMAL PERFORMANCE," Ser. No. 09/368,803.

In the embodiment of FIG. 1, each thermoelectric assembly 20 may comprise a thin-film thermoelectric assembly, such as described in one or more of U.S. Pat. Nos. 6,043,423 and 6,127,619, as well as the following articles: Fleurial et al., "Thermoelectric Microcoolers For Thermal Management Applications", 16th International Conference on Thermoelectrics, IEEE (1997), Fleurial et al., "Thick-Film Thermoelectric Microdevices", 18th International Conference on Thermoelectrics (1999), and Vandersande et al., "Thermal Management of Power Electronics Using Thermoelectric Coolers", 15th International Conference on Thermoelectrics (1996), each of which is hereby incorporated herein by reference in its entirety.

Each thermoelectric assembly includes a lower support plate 22 and an upper support plate 24 between which the thermoelectric couples or elements are disposed. Each lower support plate 22 has a larger surface area than the corresponding upper support plate 24. This larger surface area facilitates wire bonding 30 between pads on the upper surface of substrate 14 and appropriate landing pads 60 (FIG. 2A) on lower support plate 22 of each assembly. FIG. 2A is a cross-sectional plan view of the thermoelectric assembly of FIG. 2.

In one embodiment, the lower and upper support plates 22 and 24 of each thermoelectric assembly may comprise silicon. Thin-film bismuth telluride "N" and "P" thermoelectric elements are deposited on the silicon substrate. Appropriate insulating layers 42 and 44, such as silicon dioxide, separate the electrically conductive thermoelectric elements from the respective supporting silicon substrates 22 and 24. The use of silicon (or other semiconductor material) as a carrier facilitates attachment of the thermoelectric assembly to an integrated circuit chip (such as device 12 of FIG. 1, which may also be fabricated of silicon), using either a solder joint or thermal epoxy. A solder joint offers the advantage of low thermal resistance between the chip and the associated thermoelectric assembly.

Figure 2:
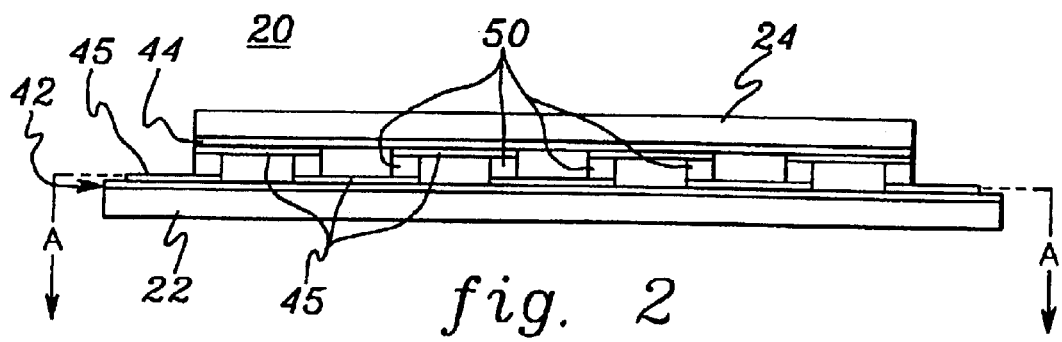
FIG. 2 is a partial elevational view illustrating one embodiment of a programmable thermoelectric cooling assembly in accordance with the principles of the present invention.
Figure 2A:
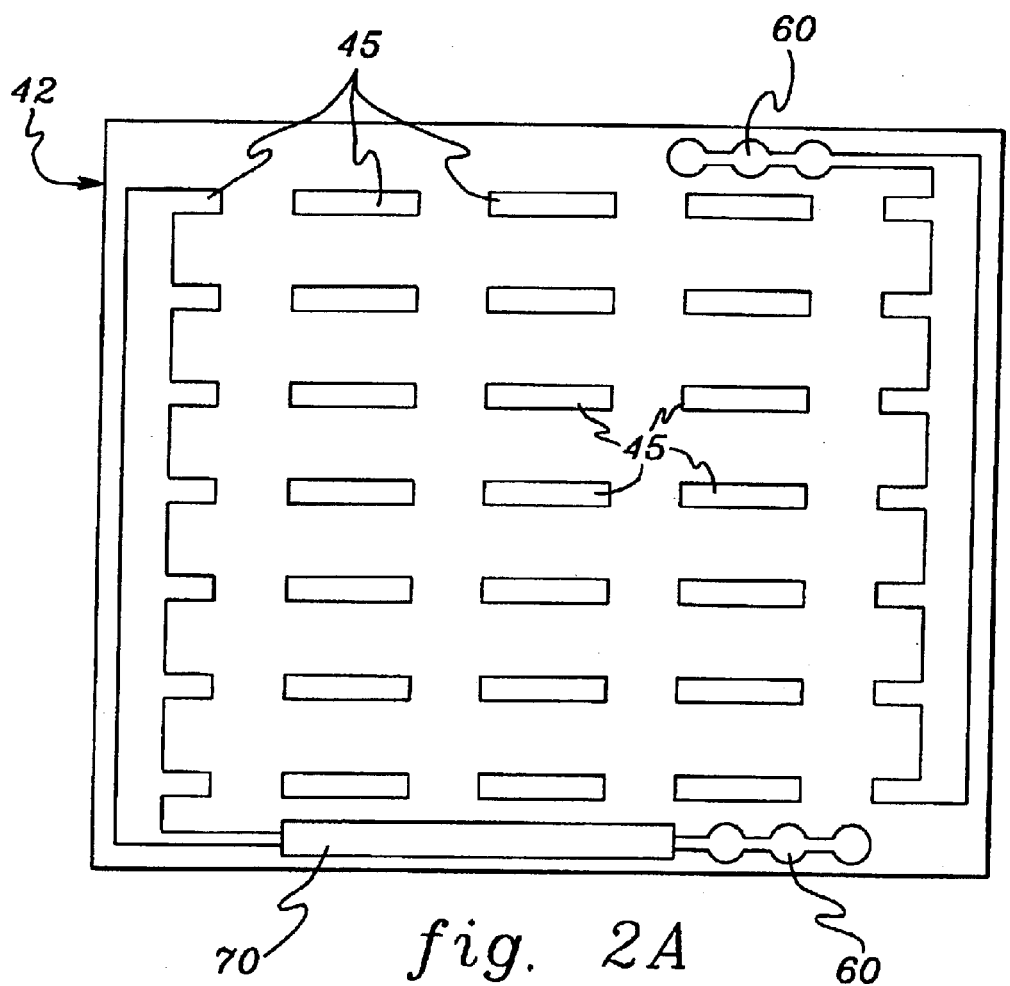
FIG. 2A is cross-sectional plan view of FIG. 2 taken along line A—A.

The silicon support plates of FIGS. 2 and 2A provide mechanical support to the thermoelectric elements, but also accommodate a specialized integrated circuit in accordance with the present invention. This specialized circuit provides a mechanism for customizing the heat load capacity of each thermoelectric assembly for the associated integrated circuit chip to be cooled. As shown in FIG. 2A, conductive lines are deposited on the silicon carrier for the purpose of distributing electrical current to and interconnecting the thermoelectric elements 50 (FIG. 2). Although not shown, a similar pattern of conductive lines and pads would be provided on the underside of the upper support plate 24 of each thermoelectric assembly.

In this embodiment, the lower support substrate is shown to accommodate the programmable voltage boost circuit 70 in accordance with the present invention. By using programmable voltage boost circuitry as described hereinbelow, electrical power provided to the integrated thermoelectric cooling assemblies from a given power source, such as a power plane disposed within substrate 14, can be tailored for each thermoelectric assembly to allow adjusting of the assembly's cooling effect given differences in the heat generation capability of the different electronic devices to which the assemblies are thermally coupled. In one embodiment, an integrated power control circuit 70 is incorporated on at least one silicon carrier of each thermoelectric assembly between the supply voltage wiring pads 60 and the current distribution lines 45 (see FIG. 2A).

FIG. 3A depict one functional diagram of a power control circuit 70 in accordance with the present invention. In this implementation, each on-carrier power control circuit 70 includes voltage boost circuit 71, 72 and 73 wired in series between the power supply (for example, 1.5 volts) and the load (i.e., thermoelectric elements). Wiring shunt lines are also provided parallel to each voltage boost circuit. Examples of ways in which these voltage booster circuit can be used to customize the voltage applied to a thermoeletric cooling chip are depicted in FIGS. 3B–3E. For purposes of this example, it is assumed that each voltage boost circuit represented by blocks 71, 72 and 73 will provide a similar voltage boost, for example, 1.5x. By making appropriate laser deletion cuts, "x" in the wiring lines, it is possible for different voltage levels varying from 1.5 to 5.06 volts (for example) to be provided as shown in FIGS. 3B–3E. This comprises a practical means of obtaining different cooling capacities from a single thermoelectric assembly design and a single substrate voltage source. Those skilled in the art will note that the number of boost circuits maybe less or more depending upon the range and granularity desired for the thermoelectric assembly. By way of example, boost circuits are described in a textbook by Robert W. Erickson, entitled, "Fundamentals of Power Electronics", published by Kluwer Academic Publishers, pp. 24 & 138 (1997), which is hereby incorporated herein by reference in its entirety.

Additionally, if desired, a microprocessor cooling system controller could monitor the electronic module temperature by a thermistor, for example, mounted within the module housing. A thermistor sense line would be fed back to the cooling system controller. If the module temperature changes, the controller can then provide a signal to a dc power controller to universally increase or decrease electric current to all thermoelectric cooling assemblies as required to quickly return the module to a set point condition or range.

Advantageously, by disposing multiple thermoelectric cooling assemblies within an electronic module, the electronic device and cooling assemblies are maintained in a controlled, i.e., oxygen and moisture free environment. Further, disclosed hereinabove is the use of thin-film integrated thermoelectric assemblies as a means of achieving reduced temperatures on individual chips within an multi-chip module. The present invention allows customizing thermoelectric cooling of higher dissipating chips compared with lower dissipating chips by programming the voltage level to be applied to the respective assembly. This tailoring of the thermoelectric assembly is achieved without adjusting the number, size or geometry of the thermoelectric elements to match the individual cooling capacity of the associated chip heat load. The present invention accomplishes programmable thermoelectric cooling using a common thermoelectric device design.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for fabricating an electric circuit comprising:
providing at least one electronic device;
coupling at least one thermoelectric assembly to said at least one electronic device, wherein each thermoelectric assembly includes a statically tailorable power control circuit for selecting, for a given power source, a voltage level to thermoelectric elements thereof from a plurality of selectable voltage levels;
connecting said given power source to said at lest one thermoelectric assembly through said programmable power control circuit; and
employing said statically tailorable power control circuit to initially tailor the voltage level to thermoelectric elements of said at least one thermoelectric assembly, said tailoring being based upon anticipated heat dissipation of said at least one electronic device to which said at least one thermoelectric assembly is thermally coupled.

2. A method for fabricating an electric circuit comprising:
providing at least one electronic device:
thermally coupling at least one thermoelectric assembly to said at least one electronic device, wherein each thermoelectric assembly includes a programmable power control circuit for adjusting, from a given power source, voltage level to thermoelectric elements thereof;
connecting said given power source to said at lest one thermoelectric assembly through said programmable power control circuit;
employing said programmable power control circuit to tailor the voltage level to thermoelectric elements of said at least one thermoelectric assembly, said tailoring being based upon anticipated heat dissipation of said at least one electronic device to which said at least one thermoelectric assembly is thermally coupled; and
further comprising mounting the at least one electronic device on a substrate, and wherein said given power source comprises at least one power plane within said substrate.

3. A method for fabricating an electric circuit comprising:
providing at least one electronic device;
thermally coupling at least one thermoelectric assembly to said at least one electronic device, wherein each thermoelectric assembly includes a programmable power control circuit for adjusting, from a given power source, voltage level to thermoelectric elements thereof;
connecting said given power source to said at lest one thermoelectric assembly through said programmable power control circuit;
employing said programmable power control circuit to tailor the voltage level to thermoelectric elements of said at least one thermoelectric assembly, said tailoring being based upon anticipated heat dissipation of said at least one electronic device to which said at least one thermoelectric assembly is thermally coupled; and
wherein each said programmable power control circuit comprises at least one voltage boost circuit connected in series between said given power source and said thermoelectric elements of its respective thermoelectric assembly, each voltage boost circuit having a wiring shunt line in parallel therewith, and wherein said employing comprises open circuiting a conductive line to or from said at least one voltage boost circuit or said wiring shunt line in parallel therewith to tailor said voltage level supplied to said thermoelectric elements.

4. The method of claim 3, wherein said open circuiting comprises laser deleting a portion of said conductive line to or from said at least one voltage boost circuit or said wiring shunt line in parallel therewith.

5. A method for fabricating an electric circuit comprising:
providing at least one electronic device;
thermally coupling at least one thermoelectric assembly to said at least one electronic device, wherein each thermoelectric assembly includes a programmable power control circuit for adjusting, from a given power source, voltage level to thermoelectric elements thereof;
connecting said given power source to said at lest one thermoelectric assembly through said programmable power control circuit;
employing said programmable power control circuit to tailor the voltage level to thermoelectric elements of said at least one thermoelectric assembly, said tailoring being based upon anticipated heat dissipation of said at least one electronic device to which said at least one thermoelectric assembly is thermally coupled; and
wherein said providing comprises providing multiple electronic devices, each electronic device comprising an integrated circuit chip, and wherein said thermally coupling comprises thermally coupling a different thermoelectric assembly to each integrated circuit chip of said multiple integrated circuit chips, wherein at least one integrated circuit chip of said multiple integrated circuit chips dissipates a greater amount of heat when operational, and wherein said employing comprises tailoring the voltage level to thermoelectric elements of said thermoelectric assembly associated with said at least one integrated circuit chip dissipating said greater amount of heat to increase the voltage level to said thermoelectric elements, thereby enhancing cooling of said integrated circuit chip dissipating said greater amount of heat.

6. The method of claim 1, further comprising providing a thermally conductive cap and sealing said thermally conductive cap to said substrate such that said at least one thermoelectric assembly is disposed between said at least one electronic device and said thermally conductive cap and is in thermal contact with said thermally conductive cap.

* * * * *

UNITED STATES PATENT AND TRADEMARK OFFICE
CERTIFICATE OF CORRECTION

PATENT NO. : 6,767,766 B2
DATED : July 27, 2004
INVENTOR(S) : Chu et al.

It is certified that error appears in the above-identified patent and that said Letters Patent is hereby corrected as shown below:

Column 2,
Line 49, delete "250°" and insert -- 25° --

Column 6,
Line 50, delete the word "depict" and insert -- depicts --

Column 7,
Line 49, delete the word "lest" and insert -- least --

Column 8,
Lines 1, 23 and 25, delete the word "lest" and insert -- least --

Signed and Sealed this

Seventh Day of December, 2004

JON W. DUDAS
*Director of the United States Patent and Trademark Office*